(12) United States Patent
Kishino

(10) Patent No.: US 9,350,320 B2
(45) Date of Patent: May 24, 2016

(54) ACOUSTIC WAVE ELEMENT AND ACOUSTIC WAVE DEVICE USING SAME

(75) Inventor: Tetsuya Kishino, Kyoto (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 355 days.

(21) Appl. No.: 14/008,292

(22) PCT Filed: Mar. 13, 2012

(86) PCT No.: PCT/JP2012/056408
§ 371 (c)(1),
(2), (4) Date: Sep. 27, 2013

(87) PCT Pub. No.: WO2012/132877
PCT Pub. Date: Oct. 4, 2012

(65) Prior Publication Data
US 2014/0015624 A1 Jan. 16, 2014

(30) Foreign Application Priority Data
Mar. 28, 2011 (JP) .................................. 2011-070063

(51) Int. Cl.
*H03H 9/25* (2006.01)
*H03H 9/145* (2006.01)
(Continued)

(52) U.S. Cl.
CPC .............. *H03H 9/54* (2013.01); *H03H 9/1085* (2013.01); *H03H 9/1452* (2013.01); *H03H 9/14541* (2013.01); *H03H 9/14547* (2013.01); *H03H 9/14579* (2013.01)

(58) Field of Classification Search
USPC ....... 310/313 R, 313 A, 313 B, 313 C, 313 D
See application file for complete search history.

(56) References Cited

U.S. PATENT DOCUMENTS

| | | | | |
|---|---|---|---|---|
| 4,160,963 A | * | 7/1979 | Hays, Jr. ........................ | 333/151 |
| 7,761,705 B2 | * | 7/2010 | Aaron et al. ................... | 713/160 |
| 7,915,976 B2 | * | 3/2011 | Tanaka ........................... | 333/195 |

(Continued)

FOREIGN PATENT DOCUMENTS

| | | |
|---|---|---|
| JP | 4-122114 A | 4/1992 |
| JP | 6-31222 U | 4/1994 |

(Continued)

OTHER PUBLICATIONS

International Search Report for PCT Application No. PCT/JP2012/056408, mailed on May 22, 2012, in 2 pages.

*Primary Examiner* — Thomas Dougherty
(74) *Attorney, Agent, or Firm* — Procopio Cory Hargreaves and Savitch LLP

(57) ABSTRACT

The IDT electrode has the first bus bar and second bus bar; the plurality of first electrode fingers and the plurality of second electrode fingers mutually intersect; the plurality of first dummy electrodes and the plurality of second dummy electrodes which have front ends facing front ends of the plurality of first electrode fingers and the plurality of second electrode fingers with the gap s1; the plurality of first auxiliary electrodes which protrude laterally from the front end side portions of the pluralities of first dummy electrodes; and the plurality of second auxiliary electrodes which protrude laterally from the front end side portions of the plurality of second dummy electrodes. The plurality of first auxiliary electrodes have edge portions located a side of the second bus bar. The edge portions are located a side of the second bus bar the more to a side of the front end.

10 Claims, 11 Drawing Sheets

(51) Int. Cl.
*H03H 9/54* (2006.01)
*H03H 9/10* (2006.01)

(56) References Cited

U.S. PATENT DOCUMENTS

| | | | | |
|---|---|---|---|---|
| 7,939,987 | B1 * | 5/2011 | Solal et al. | 310/313 R |
| 7,939,989 | B2 * | 5/2011 | Solal et al. | 310/313 B |
| 2003/0107454 | A1 | 6/2003 | Nakamura et al. | |
| 2008/0266027 | A1 | 10/2008 | Yata | |
| 2009/0295507 | A1 | 12/2009 | Kando et al. | |

FOREIGN PATENT DOCUMENTS

| | | |
|---|---|---|
| JP | 10-224177 A | 8/1998 |
| JP | 2004-343259 A | 12/2004 |
| JP | 2006-186435 A | 7/2006 |
| JP | 2006-246510 A | 9/2006 |
| JP | 2007-96527 A | 4/2007 |
| JP | 2008-92017 A | 4/2008 |
| JP | 2008/306773 A | 12/2008 |
| JP | 2009-213174 A | 9/2009 |
| WO | 2008/035525 A1 | 3/2008 |
| WO | 2008/126614 A1 | 10/2008 |

* cited by examiner 21B  23B  25B  127B  3,3a 21B  23B  25B  27B  3,3a 21B  23B  25B  227B  27B  3,3a 21B  23B  25B  227B  3,3a

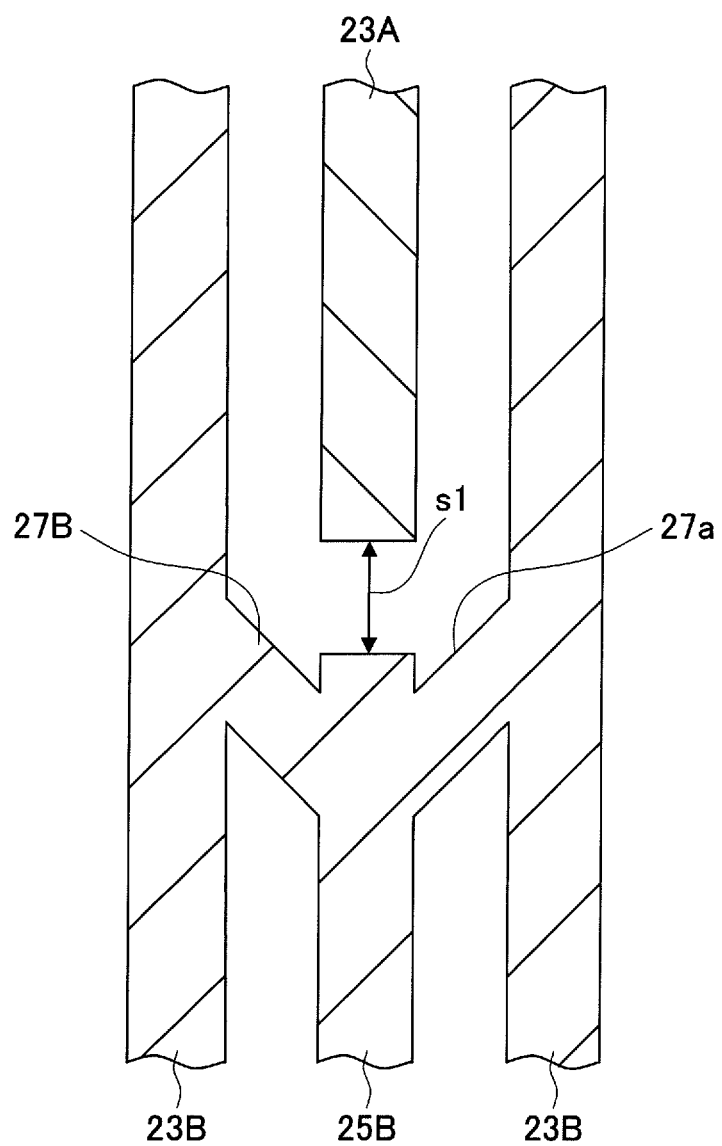

ACOUSTIC WAVE ELEMENT AND ACOUSTIC WAVE DEVICE USING SAME

TECHNICAL FIELD

The present invention relates to an acoustic wave element such as a surface acoustic wave (SAW) element and to an acoustic wave device which uses the same.

BACKGROUND ART

There is known an acoustic wave element having a piezoelectric substrate and an IDT (interdigital transducer) electrode (excitation electrode) provided on a major surface of the piezoelectric substrate (for example Patent Literature 1 or 2). The IDT electrode has a pair of comb-shaped electrodes. Each comb-shaped electrode has a bus bar which extends in a propagation direction of the SAW and a plurality of electrode fingers which extend from the bus bar in a direction perpendicular to the propagation direction of the SAW and which are arranged in the propagation direction of the SAW. Further, a pair of comb-shaped electrodes are arranged so that their plurality of electrode fingers mesh (intersect) with each other. Further, each comb-shaped electrode in Patent Literatures 1 and 2 has a dummy electrode which extends from the bus bar in the propagation direction of SAW and which has a front end facing the front end of an electrode finger of the other comb-shaped electrode with a gap interposed therebetween.

Patent Literature 1 discloses to widen the front end of the dummy electrode. In Patent Literature 1, it is considered that this configuration suppresses reflection and scattering of the SAW around the gap between the front end of the electrode finger and the front end of the dummy electrode and improves the resonance characteristic and filter characteristic of the acoustic wave element.

FIG. 15 in Patent Literature 2 discloses to connect the front end of the dummy electrode and the electrode finger which is adjacent to this dummy electrode in the propagation direction of the SAW. In Patent Literature 2, it is considered that this configuration lowers the sonic velocity in a region outside the cross range of the electrode fingers, shuts the SAW in the cross range, and improves the characteristics of the acoustic wave element.

However, in the art of Patent Literature 1, since the front end of the dummy electrode is widened, the gap between the front end of the dummy electrode and the front end of the electrode finger becomes smaller, so the chance of short-circuiting between these dummy electrode and electrode finger becomes higher. Further, the art of Patent Literature 2 does not take note of a propagation loss of the acoustic wave in the gap between the front end of the dummy electrode and the front end of the electrode finger and does not suitably suppress such propagation loss in the shape.

Accordingly, it is desired that there be provided an acoustic wave element and acoustic wave device which are capable of suppressing short-circuiting between a dummy electrode and an electrode finger while reducing the propagation loss of the acoustic wave.

CITATIONS LIST

Patent Literature

Patent Literature 1: WO2008/126614A1
Patent Literature 2: Japanese Patent Publication No. 2008-92017A

SUMMARY OF INVENTION

An acoustic wave element according to one aspect of the present invention has a piezoelectric substrate and an IDT electrode which is located on a top surface of the piezoelectric substrate. The IDT electrode has a first bus bar and a second bus bar which face each other in a direction perpendicular to a propagation direction of an acoustic wave; a plurality of first electrode fingers which extend from the first bus bar toward the second bus bar and which are aligned in the propagation direction; a plurality of second electrode fingers which extend from the second bus bar toward the first bus bar, which are aligned in the propagation direction, and which mutually intersect with the plurality of first electrode fingers; a plurality of first dummy electrodes which extend from the first bus bar toward the second bus bar, which are aligned in the propagation direction, and which have front ends which face front ends of the plurality of second electrode fingers with a gap; a plurality of second dummy electrodes which extend from the second bus bar toward the first bus bar, which are aligned in the propagation direction, and which have front ends which face front ends of the plurality of first electrode fingers with a gap; a plurality of first auxiliary electrodes which protrude toward sides from front end side portions of the plurality of first dummy electrodes; and a plurality of second auxiliary electrodes which protrude toward sides from front end side portions of the plurality of second dummy electrodes. At least part of the plurality of first auxiliary electrodes have edge portions located a side of the second bus bar, the edge portion being located closer to the side of the second bus bar the more to a side of the front end. At least part of the plurality of second auxiliary electrodes have edge portions located a side of the first bus bar, the edge portions being located closer to a side of the first bus bar the more to a side of the front end.

An acoustic wave element of an aspect of the present invention has a piezoelectric substrate and an IDT electrode which is located on a top surface of the piezoelectric substrate. The IDT electrode has a first bus bar and a second bus bar which face each other in a direction perpendicular to a propagation direction of an acoustic wave; a plurality of first electrode fingers which extend from the first bus bar toward the second bus bar and which are aligned in the propagation direction; a plurality of second electrode fingers which extend from the second bus bar toward the first bus bar, which are aligned in the propagation direction, and which mutually intersect with the plurality of first electrode fingers; a plurality of first dummy electrodes which extend from the first bus bar toward the second bus bar, which are aligned in the propagation direction, and which have front ends which face the front ends of the plurality of second electrode fingers with a gap; a plurality of second dummy electrodes which extend from the second bus bar toward the first bus bar, which are aligned in the propagation direction, and which have front ends which face the front ends of the plurality of first electrode fingers with a gap; first auxiliary electrodes which protrude from front end side portions of the plurality of first dummy electrodes with a slant relative to the propagation direction; and second auxiliary electrodes which protrude from front end side portions of the plurality of second dummy electrodes with a slant relative to the propagation direction.

An acoustic wave device of an aspect of the present invention has either of the above acoustic wave elements and a circuit board on which the acoustic wave element is mounted.

According to the above configuration, short-circuiting between a dummy electrode and an electrode finger can be suppressed while the propagation loss of the acoustic wave can be reduced.

Figure 1A:
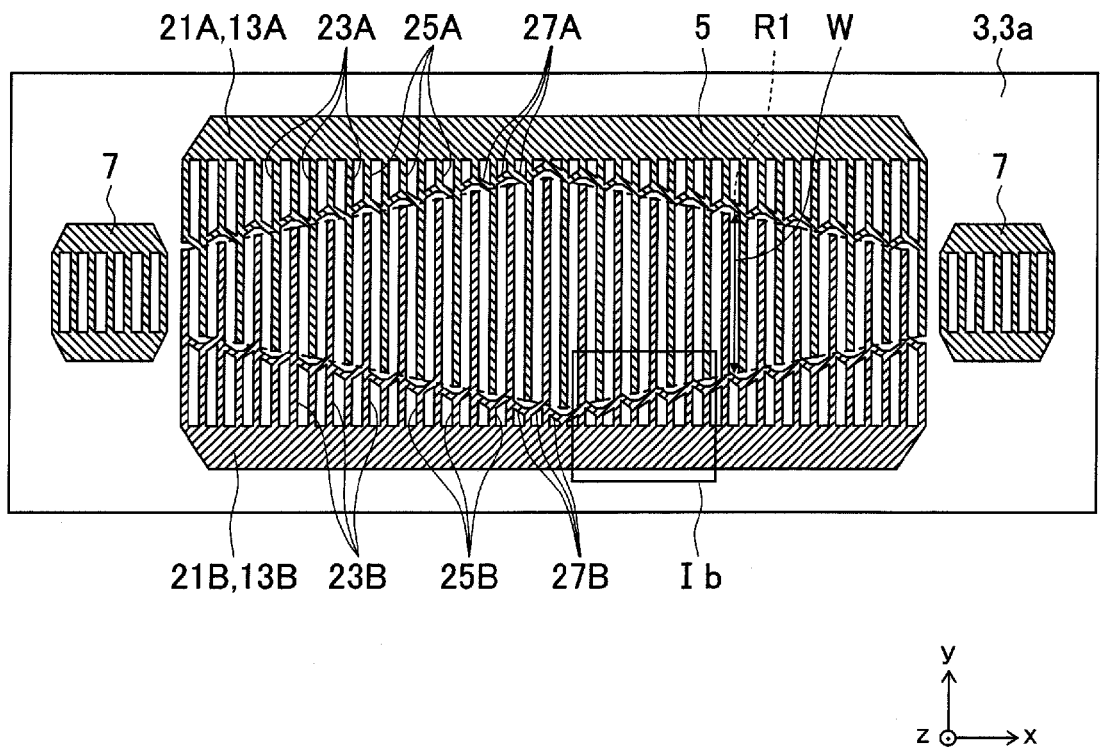
FIG. 1A is a plan view of a SAW element according to an embodiment of the present invention.
Figure 1B:
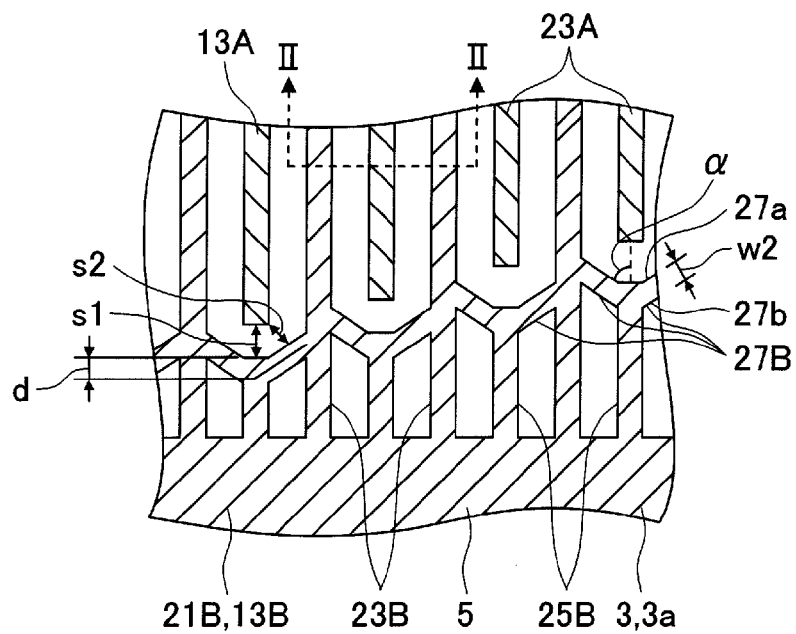
FIG. 1B is an enlarged view of a region Ib in FIG. 1A.

A cross-sectional view taken along the line II-II in FIG. 1B.

Figure 2:
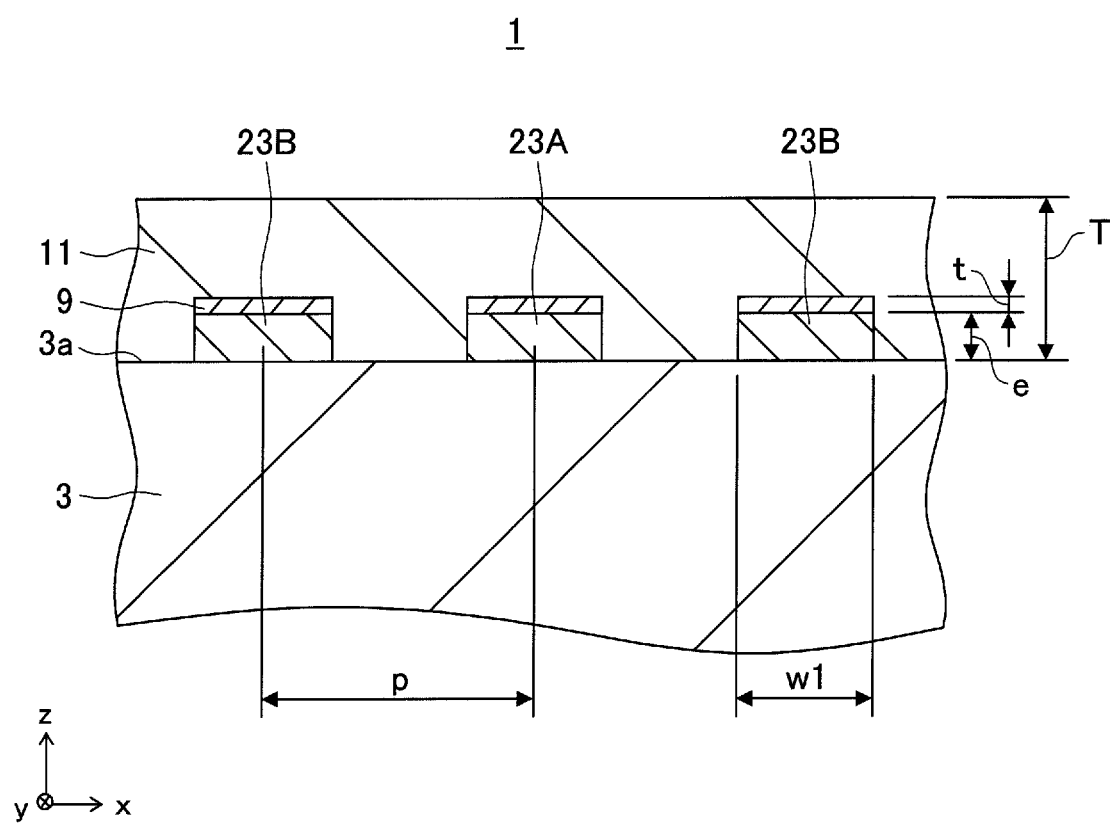

FIG. 3A to FIG. 3E are cross-sectional views, corresponding to FIG. 2, which explain a method of production of a SAW element.

A cross-sectional view which shows an example of a SAW device to which the SAW element in FIGS. 1 is applied.

FIG. 5A to FIG. 5D are enlarged plan views which show modifications of auxiliary electrodes.

A plan view which shows a modification of a bus bar.

Figure 7A:
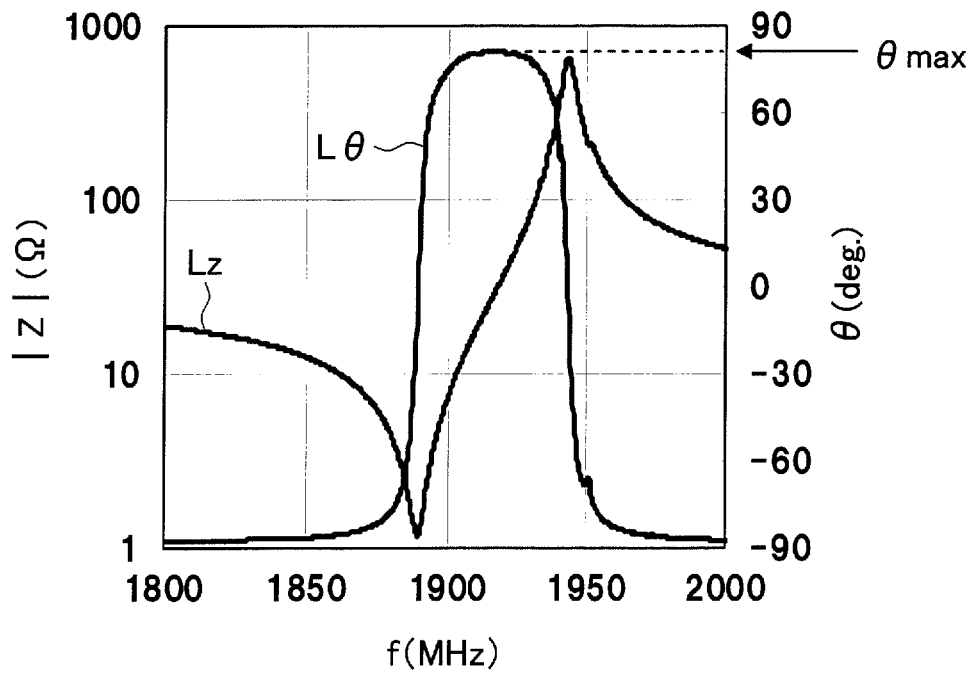
Figure 7B:
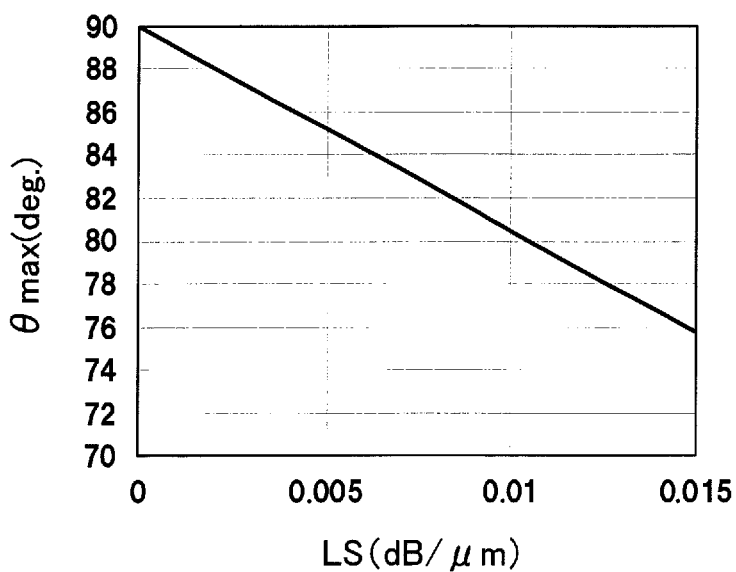

FIG. 7A and FIG. 7B are views which explain a method of evaluation of propagation loss of a SAW.

A view which shows conditions and evaluation results of comparative examples and working examples.

Figure 9A:
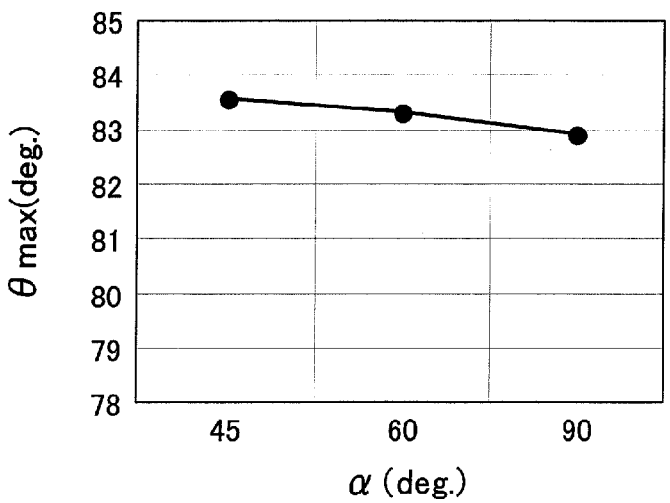
Figure 9B:
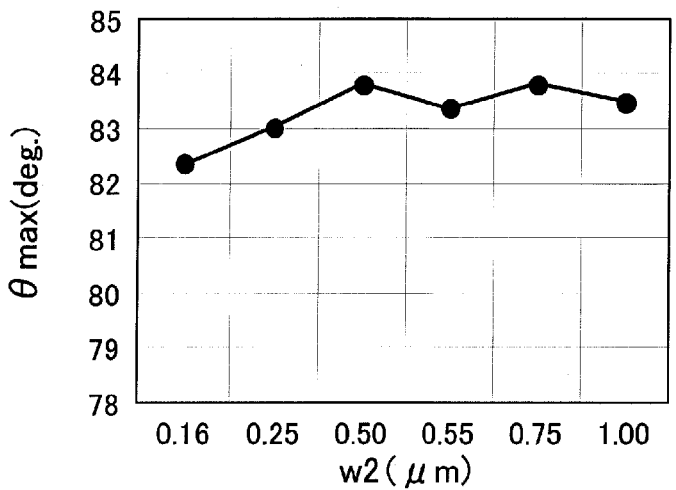
Figure 9C:
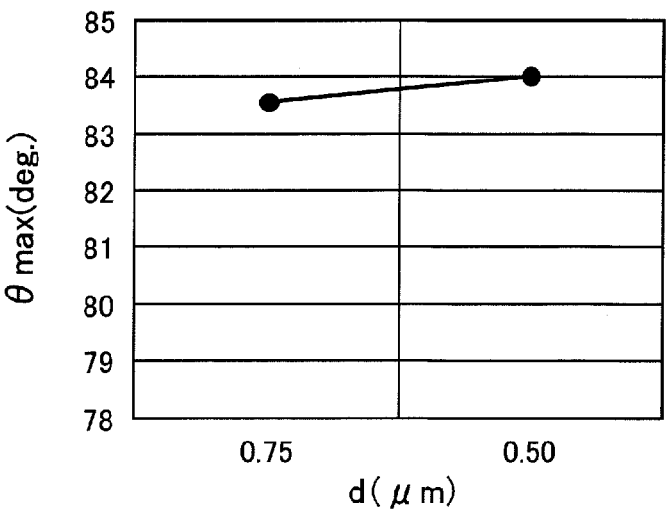

FIG. 9A to FIG. 9C are views which show an influence of the dimensions of an auxiliary electrode exerted upon the propagation loss of an SAW.

Figure 10A:
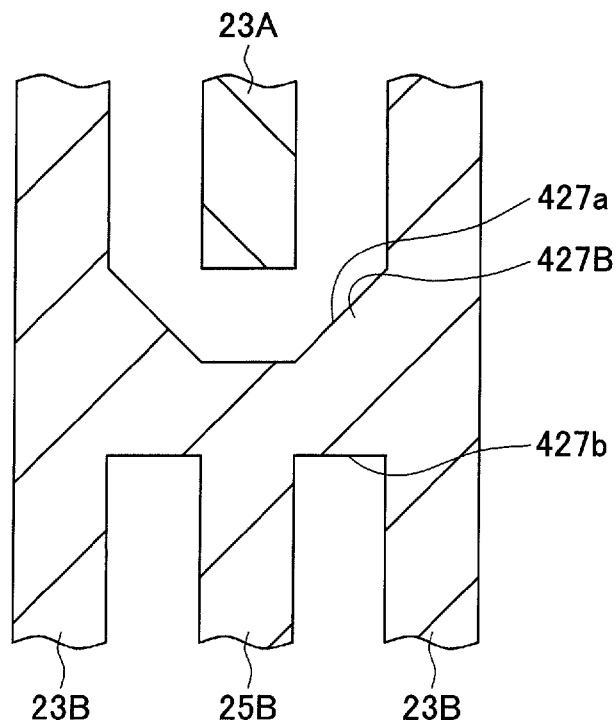
Figure 10B:
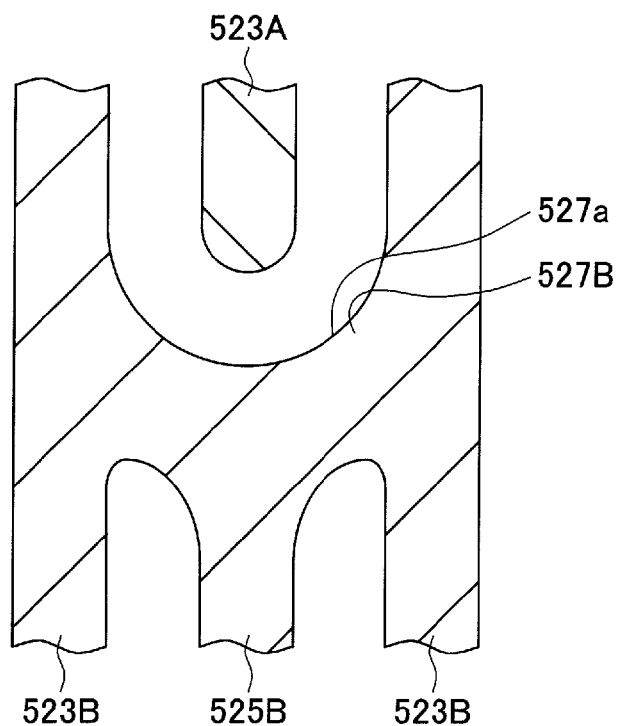

FIG. 10A and FIG. 10B are enlarged plan views which show other modifications of the auxiliary electrode.

An enlarged plan view which shows still another modification of the auxiliary electrode.

DESCRIPTION OF EMBODIMENTS

Below, surface acoustic wave elements (hereinafter, also referred to as a "SAW elements") and surface acoustic wave devices (hereinafter, also referred to as "SAW devices") according to embodiments of the present invention are explained with reference to the drawings. Note that, the drawings used in the following explanation are schematic ones. The dimensions, ratios, etc. in the drawings do not always coincide with the actual ones.

(Configuration and Method of Production of SAW Element)

FIG. 1A is a plan view of principal parts of a SAW element 1 according to an embodiment of the present invention. FIG. 1B is an enlarged view of a region Ib in FIG. 1A. FIG. 2 is a cross-sectional view taken along the line II-II in FIG. 1B.

Note that, in the SAW element 1, any direction may be made considered upward or downward. However, in the following description, for convenience, a Cartesian coordinate system xyz is defined, and use is made of a "top surface", "bottom surface", and other terms where the positive side of the z-direction is made the upward side.

The SAW element 1 has a substrate 3, an IDT electrode 5 and reflectors 7 which are provided on a top surface 3a of the substrate 3, added films 9 (FIG. 2) which are provided on the IDT electrode 5 and reflectors 7, and a protective layer 11 (FIG. 2) which covers the top surface 3a from the tops of the added films 9. Note that, other than these, the SAW element 1 may have lines for inputting and outputting signals to and from the IDT electrode 5 and so on.

The substrate 3 is configured by a piezoelectric substrate. Specifically, for example, the substrate 3 is configured by a substrate of a single crystal which has piezoelectricity such as a lithium tantalate ($LiTaO_3$) single crystal or lithium niobate ($LiNbO_3$) single crystal. More preferably, the substrate 3 is configured by a 128°±10° Y-X cut $LiNbO_3$ substrate. The planar shape and various dimensions of the substrate 3 may be suitably set. As an example, the thickness of the substrate 3 (z-direction) is 0.2 mm to 0.5 mm.

The IDT electrode 5 has a first comb-shaped electrode 13A and a second comb-shaped electrode 13B. Note that, in the following description, sometimes the first comb-shaped electrode 13A and second comb-shaped electrode 13B are simply referred to as the comb-shaped electrodes 13 and are not distinguished. Further, for compositions according to the first comb-shaped electrode 13A, sometimes "first" and "A" are attached, for example, as with a "first bus bar 21A". For compositions according to the second comb-shaped electrode 13B, sometimes "second" and "B" are attached, for example, as with a "second bus bar 21B". Further, sometimes "first", "second", "A", and "B" are omitted.

Each comb-shaped electrode 13 has a bus bar 21 (FIG. 1A) which extends in the propagation direction of the SAW (x-direction) and a plurality of electrode fingers 23 which extend from the bus bars 21 in a direction (y-direction) perpendicular to the propagation direction. Further, the pair of comb-shaped electrodes 13 are arranged so that their plurality of electrode fingers 23 mesh with each other (so that they intersect each other). Further, each comb-shaped electrode 13 has a plurality of dummy electrodes 25 which are arranged among the plurality of electrode fingers 23 and extend from the bus bar 21 in the direction (y-direction) perpendicular to the propagation direction of the SAW and a plurality of auxiliary electrodes 27 which extend laterally from the front end side portions of the dummy electrodes 25.

The bus bars 21 are for example formed in long shapes which extend with roughly constant widths and are arranged parallel to the propagation direction of the SAW. Further, the pair of bus bars 21 face each other in the direction perpendicular to the propagation direction of the SAW.

The pluralities of electrode fingers 23 are aligned in the propagation direction of the SAW at roughly constant intervals. The pluralities of electrode fingers 23 of the pair of comb-shaped electrodes 13 are provided so that their pitches (repetition intervals) "p" (FIG. 2. For example, distances between the centers of the electrode fingers 23) become equivalent to for example a half wavelength of the wavelength $\lambda$ of the SAW at a frequency to be resonated. The wavelength $\lambda$ (2 p) is for example 1.5 μm to 6 μm. The width w1 (FIG. 2) of each electrode finger 23 is suitably set in accordance with the electrical characteristics etc. demanded from the SAW element 1 and is for example 0.4 p to 0.6 p with respect to the pitch "p".

The lengths of the pluralities of electrode fingers 23 (positions of their front ends in the y-direction) vary in the propagation direction of the SAW. Accordingly, the widths W (the lengths in the direction (y-direction) perpendicular to the propagation direction of the SAW, i.e., the intersection widths of the electrode fingers 23) of a cross range R1 indicated by a dotted line (line connecting the front ends of the plurality of electrode fingers 23) in FIG. 1A varies in the propagation direction of the SAW (x-direction). That is, the IDT electrode 5 is apodized. By such apodizing, generation of so-called lateral mode spurious noise is suppressed.

A plurality of dummy electrodes 25 are arranged at each comb-shaped electrode 13 at roughly constant intervals (pitch "p") together with the plurality of electrode fingers 23. Further, the front ends of the dummy electrodes 25 of one comb-shaped electrode 13 face the front ends of electrode fingers 23 of the other comb-shaped electrode 13 across a predetermined gap s1 (FIG. 1B). The size of the gap s1 (y-direction. In the following description, this size is sometimes expressed by the notation "s1" as well) is roughly constant among the plurality of dummy electrodes 25. The positions (lengths) of the front ends of the dummy electrodes 25 vary in the propagation direction of the SAW corresponding to the variation of their intersection widths W in the propagation direction of the SAW. The various dimensions of the dummy electrodes 25 may be suitably set. For example, the width of a dummy electrode 25 is made equal to the width w1 of the electrode finger 23, and the size of the gap s1 is made about $\lambda/8$ to $\lambda/2$ (p).

Pluralities of auxiliary electrodes 27 protrude from the lateral edge portions of the front ends of the pluralities of dummy electrodes 25. Among the pluralities of dummy electrodes 25, the dummy electrodes 25 on the two sides of which electrode fingers 23 which extend from the same bus bar 21 as that for themselves are positioned (in the present embodiment, the dummy electrodes 25 other than the dummy electrodes 25 located at the end parts of the IDT electrode 5) have auxiliary electrodes 27 which protrude from the lateral edge portions of the two sides.

The front ends of the auxiliary electrodes 27 are connected to the lateral edge portions of the electrode fingers 23 which are adjacent to the dummy electrodes 25 at the base ends of the auxiliary electrodes 27 and which extend from the same bus bars 21 as the dummy electrodes 25. That is, the auxiliary electrodes 27 connect the dummy electrodes 25 and the electrode fingers 23 which should become the same potential.

The auxiliary electrodes 27 extend for example with an inclination so that the closer to the front end sides (sides which are connected to the electrode fingers 23), the closer in position to the bus bar 21 side of the other comb-shaped electrode 13. That is, the first auxiliary electrodes 27A extend with an inclination so that the closer to the front end sides, the closer in position to the bus bar 21B side, while the second auxiliary electrodes 27B extend with an inclination so that the closer to the front end sides, the closer in position to the first bus bar 21A side.

If paying attention to the edge portions 27a (FIG. 1B) of the auxiliary electrodes 27 on the bus bar 21 side of the other comb-shaped electrode 13 and the edge portions 27b (FIG. 1B) on the opposite sides of the same, the edge portions 27a and edge portions 27b of the first auxiliary electrodes 27A extend with an inclination so that the closer to the front end sides, the closer in position to the second bus bar 21B side, and the edge portions 27a and edge portions 27b of the second auxiliary electrodes 27B extend with an inclination so that the closer to the front end sides, the closer in position to the first bus bar 21A side.

Regarding the auxiliary electrodes 27, the width w2, the angle $\alpha$ relative to the direction (y-direction) perpendicular to the propagation direction of the SAW, and the connection position with respect to a dummy electrode 25 maybe suitably set. Note that, the connection position is defined by for example the distance "d" between the crossing position between the center line of an auxiliary electrode 27 and the center line of a dummy electrode 25 and the front end of the dummy electrode 25. The width w2 is for example equal to the width w1 of the electrode fingers 23 and dummy electrodes 25, the angle $\alpha$ is for example about 45 degrees, and the distance "d" is for example $0.20\lambda$ to $0.40\lambda$ with respect to the wavelength $\lambda$ of the SAW.

Note that, FIG. 1A etc. are schematic diagrams. In actuality, a plurality of pairs of comb-shaped electrodes each having a larger number of electrode fingers 23 etc. than this may be provided. Further, a ladder type SAW filter in which a plurality of IDT electrodes 5 are connected by serial connection, parallel connection, or another method may be configured, or a dual mode SAW resonator filter in which a plurality of IDT electrodes 5 are arranged along the x-direction etc. may be configured.

The IDT electrode 5 is formed by for example a metal. As this metal, Al or an alloy (Al alloy) containing Al as the major component can be mentioned. The Al alloy is for example an Al—Cu alloy. Note that, the IDT electrode 5 may be configured by a plurality of metal layers. The various dimensions of the IDT electrode 5 are suitably set in accordance with the electrical characteristics etc. demanded from the SAW element 1. As an example, the thickness "e" (FIG. 2) of the IDT electrode 5 is 100 nm to 300 nm.

Note that, the IDT electrode 5 may be directly arranged on the top surface 3a of the substrate 3 or may be arranged on the top surface 3a of the substrate 3 through another member. The other member is made of for example Ti, Cr, or an alloy of the same. When the IDT electrode 5 is arranged on the top surface 3a of the substrate 3 through another member in this way, the thickness of the other member is set to a thickness of an extent whereby almost no influence is exerted upon the electrical characteristics of the IDT electrode 5 (for example a thickness of 5% based on the thickness of the IDT electrode 5 in the case of Ti).

When voltage is applied to the substrate 3 by the IDT electrode 5, a SAW which propagates in the x-direction along the top surface 3a is induced near the top surface 3a of the substrate 3. Further, the SAW is reflected at boundaries between the electrode fingers 23 and regions in which the electrode fingers 23 are not arranged. Further, a standing wave defining the pitch of the electrode fingers 23 as a half wavelength is formed. The standing wave is converted to an electrical signal having the same frequency as that of the standing wave and is extracted by the electrode fingers 23. In this way, the SAW element 1 functions as a resonator or filter.

The reflectors 7 are formed in a lattice shape having a pitch roughly equal to the pitch "p" of the electrode fingers 23 of the IDT electrode 5. The reflectors 7 are for example formed by the same material as that for the IDT electrode 5 and are formed to a thickness equal to that of the IDT electrode 5.

The protective layer 11 is for example provided over roughly the entire surface of the top surface 3a of the substrate 3, covers the IDT electrode 9 and reflectors 7 which are provided with the added films 9, and covers the portion of the top surface 3a which is exposed from the IDT electrode 5 and the reflectors 7. The thickness T (FIG. 2) of the protective layer 11 from the top surface 3a is set larger than the thickness "e" of the IDT electrode 5 and reflectors 7. For example, the thickness T is thicker than the thickness "e" by 100 nm or more and is 200 nm to 700 nm. Further, for example, the thickness T is $0.2\lambda$ to $0.5\lambda$ relative to the wavelength $\lambda$ of the SAW from another viewpoint.

The protective layer 11 is made of a material having an insulation property. Preferably, the protective layer 11 is formed by a material in which the propagation velocity of the acoustic wave becomes faster when the temperature rises, such as $SiO_2$. The change of the electrical characteristics of the SAW element 1 due to a change of the temperature can be kept small by this. Specifically, this is as follows.

When the temperature of the substrate 3 rises, the propagation velocity of the SAW on the substrate 3 becomes slower, and the pitch "p" becomes large due to thermal expansion of the substrate 3. As a result, the resonant frequency becomes lower, so the desired characteristics are liable to not be obtained. However, when the protective layer 11 is provided, the acoustic wave propagates not only on the substrate, but also in the protective layer 11. Further, the protective layer 11 is formed by a material ($SiO_2$) in which the propagation velocity of the acoustic wave becomes faster when the temperature rises, therefore the change of the velocity due to the temperature rise is suppressed in the SAW propagating through the substrate 3 and protective layer 11 as a whole. Note that, the protective layer 11 contributes to the protection of the IDT electrode 5 from corrosion etc. as well.

The surface of the protective layer 11 is desirably made free from large concave-convex shapes. The propagation velocity of the SAW propagating on the substrate 3 changes when influenced by concave-convex shapes of the surface of the protective layer 11. Therefore, if large concave-convex shapes exist on the surface of the protective layer 11, a large variation arises in the resonant frequencies of the produced SAW elements 1. Accordingly, when making the surface of the protective layer 11 flat, the resonant frequency of each acoustic wave element is stabilized. Specifically, desirably the flatness of the surface of the protective layer 11 is made 1% or less based on the wavelength of the SAW propagating on the substrate 3.

The added films 9 are for improving the electrical characteristics of the IDT electrode 5 and reflectors 7. The added films 9 are for example provided over the entire surfaces of the top surfaces of the IDT electrode 5 and reflectors 7. The added films 9 have cross-sectional shapes perpendicular to the longitudinal direction of the electrode fingers 23 (y-direction) made for example approximately rectangular. Note, the cross-sectional shapes of the added films 9 may be trapezoidal or dome shaped as well. The thickness "t" (FIG. 2) of the added films 9 may be suitably set within the range where the added films 9 are not exposed from the protective layer 11. For example, the thickness of the added films 9 is $0.01\lambda$ to $0.4\lambda$ based on the wavelength A of the SAW.

The material configuring the added films 9 is a material having a different acoustic impedance from the materials configuring the IDT electrode 5, reflectors 7, and protective layer 11. The difference of the acoustic impedance is preferably a certain extent or more. For example, it is preferably 15 MRayl or more, more preferably 20 MRayl or more.

As such materials, for example, when the IDT electrode 5 is configured by Al (acoustic impedance: 13.5 MRayl) and the protective layer 11 is configured by $SiO_2$ (12.2 MRayl), there can be mentioned WC (102.5 MRayl), TiN (56.0 MRayl), $TaSiO_2$ (40.6 MRayl), $Ta_2O_5$ (33.8 MRayl), and $W_5Si_2$ (67.4 MRayl).

When the IDT electrode 5 is configured by Al and the protective layer 11 is configured by $SiO_2$, their acoustic impedances are close, therefore the boundaries between the electrode fingers 23 and the regions in which electrode fingers 23 are not arranged acoustically becomes vague, so the reflection coefficient at the boundaries falls. As a result, the reflection wave of the SAW is not sufficiently obtained, so the desired characteristics are liable to not be obtained. However, by provision of the added films 9, which are formed by a material having a different acoustic impedance from those of the IDT electrode 5 and the protective layer 11, on the top surface of the IDT electrode 5, the reflection coefficient at the boundaries between the electrode fingers 23 and the regions in which electrode fingers 23 are not arranged becomes higher, so it becomes easy to obtain the desired characteristics.

Note that, the material of the added films 9 preferably has a slower propagation velocity of an acoustic wave than the materials of the IDT electrode 5, reflectors 7, and protective layer 11. Due to the slow propagation velocity, vibrational distribution is apt to be concentrated at the added films 9, therefore the reflection coefficient at the boundaries between the electrode fingers 23 and the regions in which electrode fingers 23 are not arranged effectively becomes higher.

As such materials, for example, when the IDT electrode 5 is configured by Al (propagation velocity: 5020 m/s) and the protective layer 11 is configured by $SiO_2$ (5560 m/s), there can be mentioned $TaSiO_2$ (4438 m/s), $Ta_2O_5$ (4352 m/s), and $W_5Si_2$ (4465 m/s). Note that, it is considered that, among the materials having slower propagation velocities of acoustic waves than the materials of the IDT electrode 5 etc., the degree of freedom of selection is higher in a material having a larger acoustic impedance than the materials of the IDT electrode 5 etc. compared with a material having a smaller acoustic impedance than the materials of the IDT electrode 5 etc.

FIG. 3A to FIG. 3E are cross-sectional views for manufacturing steps, which explain summary of production of the SAW element 1 and which correspond to FIG. 2. The manufacturing steps advance from FIG. 3A to FIG. 3E in that order. Note that, the various types of layers change in shape etc. along with the advance of the process. However, common notations are sometimes used before and after the change.

Figure 3A:
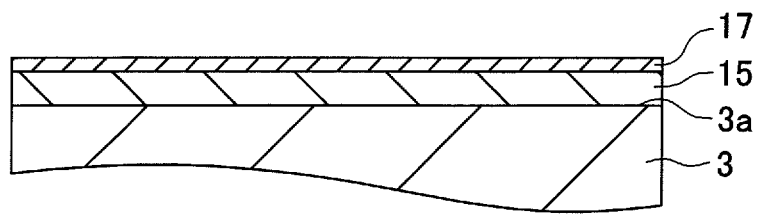

As shown in FIG. 3A, first, on the top surface 3a of the substrate 3, a conductive layer 15 which becomes the IDT electrode 5 and reflectors 7 and an additional layer 17 which becomes the added films 9 are formed. Specifically, first, a thin film forming method such as a sputtering process, a vapor deposition process or a CVD (chemical vapor deposition) process is used to form the conductive layer 15 on the top surface 3a. Next, such a thin-film forming method is used to form the additional layer 17.

Figure 3B:
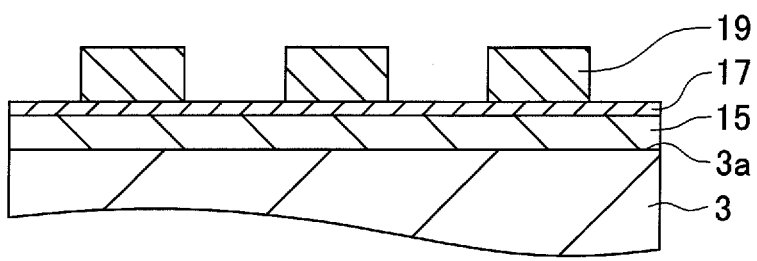

When the additional layer 17 is formed, as shown in FIG. 3B, a resist layer 19 is formed as a mask for etching the additional layer 17 and conductive layer 15. Specifically, a thin film of a negative type or positive type photosensitive resin is formed by a suitable thin-film forming method, then portions of the thin film are removed by a photolithography process or the like at the positions where the IDT electrode 5 and reflectors 7 etc. are not arranged.

Figure 3C:
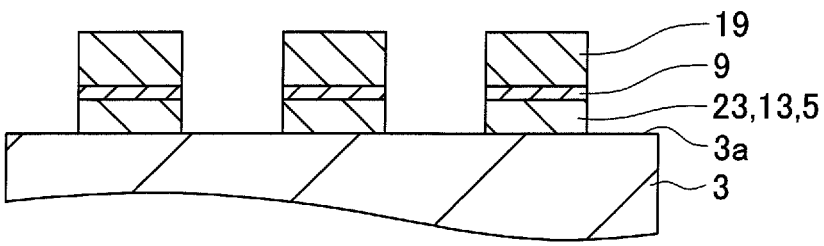
Figure 3D:
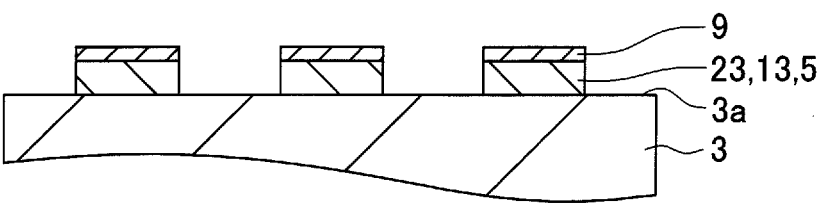

Next, as shown in FIG. 3C, a suitable etching method such as an RIE (reactive ion etching) is used to etch the additional layer 17 and conductive layer 15. Due to this, the IDT electrode 5 and reflectors 7 which are provided with the added films 9 are formed. After that, as shown in FIG. 3D, a suitable chemical solution is used to remove the resist layer 19.

Figure 3E:
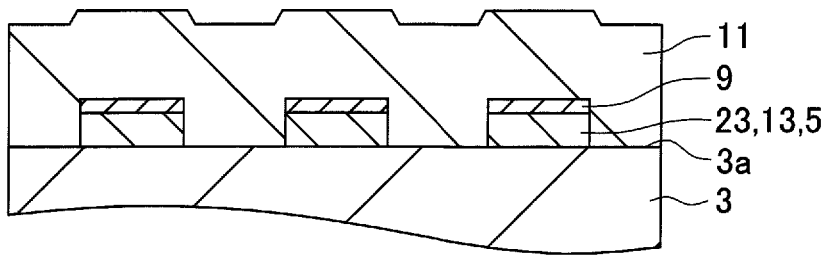

Further, as shown in FIG. 3E, a suitable thin-film forming method such as the sputtering process or CVD process is used to form a thin film which becomes the protective layer 11. At this point of time, concave-convex shapes are formed on the surface of the thin film which becomes the protective layer 11 due to the thicknesses of the IDT electrode 5 etc. Further, according to need, the surface is flattened by chemical mechanical polishing or the like, whereby the protective layer 11 is formed as shown in FIG. 2. Note that, in the protective layer 11, before or after the flattening, portions may be removed by the photolithography process or the like in order to expose a pad 39 (FIG. 4) etc. which are explained later.

(Configuration of SAW Device)

Figure 4:
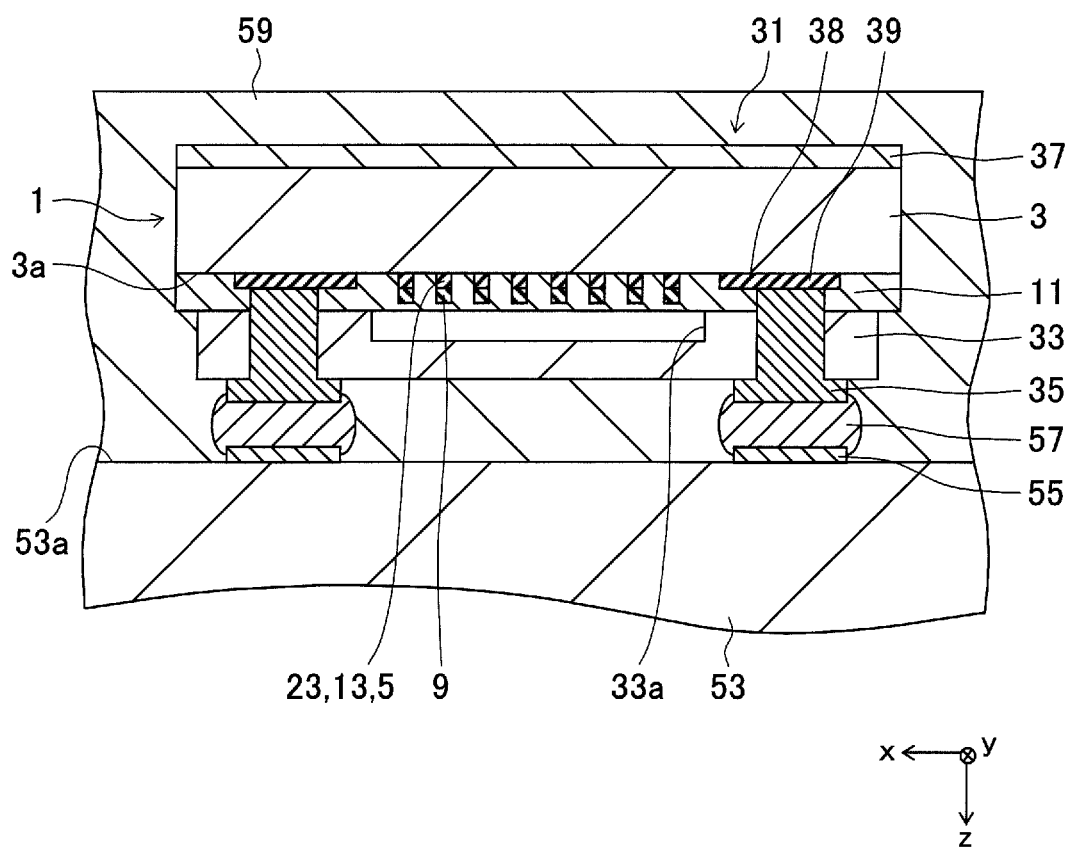

FIG. 4 is a cross-sectional view which shows an example of a SAW device 51 to which the SAW element 1 explained above is applied.

The SAW device 51 configures for example a filter or duplexer. The SAW device 51 has a SAW element 31 and a circuit board 53 on which the SAW element 31 is mounted.

The SAW element 31 is for example configured as a so-called wafer level package SAW element. The SAW element 31 has the SAW element 1 explained above, a cover 33 covering the SAW element 1 side of the substrate 3, terminals 35 penetrating through the cover 33, and a back surface portion 37 covering the substrate 3 on the opposite side to the SAW element 1.

The cover 33 is configured by a plastic or the like and forms a vibration space 33a above the IDT electrode 5 and reflectors 7 (positive side in the z-direction) for facilitating the propagation of the SAW. On the top surface 3a of the substrate 3, lines 38 which are connected to the IDT electrode 5 are formed and pads 39 which are connected to the interconnects 38 are formed. The terminals 35 are formed on the pads 39 and are electrically connected to the IDT electrode 5. Though not particularly shown, the back surface portion 37 for example has a back surface electrode for discharging electric charges built up in the surface of the substrate 3 due to temperature changes etc. and a protective layer which covers the back surface electrode.

The circuit board 53 is configured for example by a so-called rigid type printed circuit board. On a mounting surface 53a of the circuit board 53, mounting-use pads 55 are formed.

The SAW element 31 is arranged so that the cover 33 side faces the mounting surface 53a. Further, the terminals 35 and the mounting-use pads 55 are bonded by solder 57. After that, the SAW element 31 is sealed by a sealing resin 59.

According to the above embodiment, the SAW element 1 has the substrate 3 and the IDT electrode 5 which is located on the top surface 3a of the substrate 3. The IDT electrode 5 has the first bus bar 21A and second bus bar 21B which face each other in the direction (y-direction) perpendicular to the propagation direction of the SAW, the plurality of first electrode fingers 23A which extend from the first bus bar 21A toward the second bus bar 21B and which are aligned in the propagation direction (x-direction), the plurality of second electrode fingers 23B which extend from the second bus bar 21B toward the first bus bar 21A, which are aligned in the x-direction, and which mutually intersect with the plurality of first electrode fingers 23A, the plurality of first dummy electrodes 25A which extend from the first bus bar 21A toward the second bus bar 21B, which are aligned in the x-direction, and which have front ends which face the front ends of the second electrode fingers 23B across the gap s1, the plurality of second dummy electrodes 25B which extend from the second bus bar 21B toward the first bus bar 21A, which are aligned in the x-direction, and which have front ends which mutually face the front ends of the plurality of first electrode fingers 23A across the gap s1, the plurality of first auxiliary electrodes 27A which protrude laterally from the front end side portions of the pluralities of first dummy electrodes 25, and the plurality of second auxiliary electrodes 27B which protrude laterally from the front end side portions of the plurality of second dummy electrodes 25B. Further, in the plurality of first auxiliary electrodes 27A, the closer the edge portions 27a on the second bus bar 21B side to the front end sides, the closer in position to the second bus bar 21B side. In the plurality of second auxiliary electrodes 27B, the closer the edge portions 27a on the first bus bar 21A side to the front end sides, the closer in position to the first bus bar 21A side.

Accordingly, the auxiliary electrodes 27 can secure a distance from the front ends of the electrode fingers 23 having a different potential from them (belonging to different comb-shaped electrodes 13) while reducing the gap s1 between the electrode fingers 23 and the dummy electrodes 25 when viewed in the propagation direction of the SAW (x-direction). As a result, short-circuiting between the electrode fingers 23 and the dummy electrodes 25 (for example the first electrode fingers 23A and the second dummy electrodes 25B) having different potentials from each other is suppressed, and dispersion of the SAW in the gap s1 and consequent propagation loss of the SAW is suppressed.

The IDT electrode 5 is an apodized electrode in which the positions of the front ends of the plurality of first electrode fingers 23A, plurality of second electrode fingers 23B, plurality of first dummy electrodes 25A, and plurality of second dummy electrodes 25B in the y-direction vary relative to the propagation direction (x-direction).

In such an apodized electrode, generation of lateral mode spurious noise is suppressed. However, at a position where the intersection width W becomes narrow, the gap s1 becomes positioned at the center side between the pair of bus bars 21, therefore dispersion of the SAW easily occurs. Accordingly, in such an apodized electrode, the effect of suppression of dispersion of the SAW due the auxiliary electrodes 27 remarkably appears. Further, an SAW element excellent in suppression of generation of lateral mode spurious noise and in suppression of propagation loss of the SAW is obtained.

At least a portion of the plurality of first dummy electrodes 25A have first electrode fingers 23A located at their two sides and have pairs of first auxiliary electrodes 27A which protrude from the front end side portions to their two lateral sides. Further, in both electrodes of each pair of first auxiliary electrodes 27A, the closer the edge portion 27a on the second bus bar 21B side to the front end side, the closer in position to the second bus bar 21B side. This is true also for the second comb-shaped electrode 13B side.

Accordingly, two auxiliary electrodes 27 are arranged so as to sandwich the gap s1, therefore dispersion of the SAW in the two propagation directions, i.e., from another viewpoint, both of the excited SAW and the reflected SAW, can be suitably suppressed. Further, it becomes easier to secure the areas of the auxiliary electrodes 27 around the gaps s1, therefore the effect of suppression of dispersion of the SAW is improved from this point as well.

The plurality of first auxiliary electrodes 27A are connected at their front ends to the plurality of first electrode fingers 23A, while the plurality of second auxiliary electrodes 27B are connected at their front ends to the plurality of second electrode fingers 23B.

Accordingly, the potentials of the electrode fingers 23, dummy electrodes 25, and auxiliary electrodes 27 which should become the same potential are relatively stabilized, therefore stabilization of the electrical characteristics of the IDT electrode 5 can be expected. Further, the dummy electrodes 25 and electrode fingers 23 are connected to the neighboring electrode fingers 23 and dummy electrodes 25 through the auxiliary electrodes 27 even when there are parts missing at the base portions due to problems in the process, therefore the electrical connection is maintained. For this reason, improvement of the yield can be expected. Further, as explained above, when the first auxiliary electrodes 27A are provided on the two lateral sides of the dummy electrodes 25 on two sides of which electrode fingers 23 are positioned, outside of the cross range R1, the gaps between the front ends of the dummy electrodes 25 and the electrode fingers 23 which are aligned in parallel with the dummy electrodes 25 are closed over (roughly) the entire propagation direction of the SAW. Therefore, suppression of dispersion of the SAW to the outside of the cross range R1 can be expected.

The SAW element 1 further has the protective layer 11 made of $SiO_2$ which covers the IDT electrode 5 and the top surface 3a of the substrate 3 and has a thickness T from the top surface 3a larger than the thickness "e" of the IDT electrode 5. The IDT electrode is made of Al or an alloy containing Al as the major component.

Accordingly, as already explained, a SAW element excellent in the temperature characteristics is obtained. Further, in the gaps s1, there is the protective layer 11 having the same acoustic impedance as that of the IDT electrode 5. As a result, it is considered that dispersion of the SAW in the gaps s1 is suppressed. That dispersion suppression effect is added on the dispersion suppression effect by the auxiliary electrodes 27, so the propagation loss of the SAW is further suppressed. From another viewpoint, the protective layer 11 can contribute to the suppression of dispersion of the SAW, therefore it is possible to make the auxiliary electrodes 27 smaller and consequently a distance can be secured between the electrode fingers 23 and the dummy electrodes 25 which should have different potentials.

The SAW element 1 further has the added films 9 which are positioned on the top surface of the IDT electrode 5, are covered by the protective layer 11, and are made of a material having a larger acoustic impedance and slower propagation velocity of acoustic waves compared with the material of the IDT electrode 5 and the material of the protective layer 11.

Accordingly, as already explained, the shortcoming of the protective layer 11 concerning the reflection coefficient can be alleviated. If the added films 9 are provided, the effect of suppression of dispersion of the SAW in the gaps s1 by the protective layer 11 is reduced. Accordingly, the dispersion suppression effect by the auxiliary electrodes 27 becomes conspicuous. Further, an SAW element excellent in temperature characteristics, capable of sufficiently securing the reflection coefficient of the SAW, and excellent in the suppression of the propagation loss of the SAW is obtained.

(Modifications)

FIG. 5A to FIG. 5D are views which show modifications of the planar shapes of the auxiliary electrodes and correspond to FIG. 1B. Note that, these diagrams show the shapes of the second auxiliary electrodes 27B, 127B, and 227B on the second bus bar 21B side, but the shapes of the first auxiliary electrodes on the first bus bar 21B side are the same as the shapes of the second auxiliary electrodes.

Figure 5A:
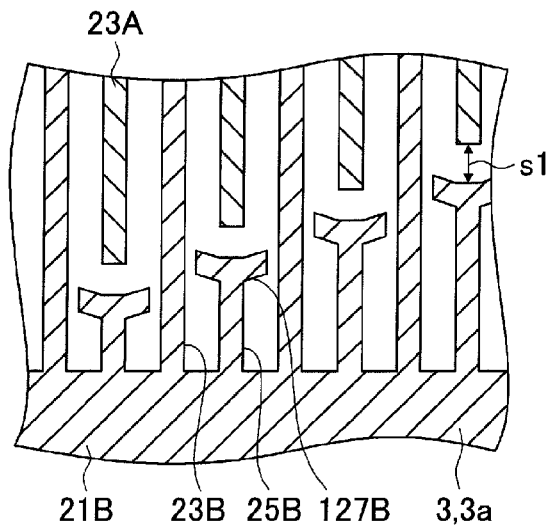

In the modification of FIG. 5A, the auxiliary electrodes 127 are not connected at the front ends to the electrode fingers 23 which should become the same potential. Even in this case, in the same way as the auxiliary electrodes 27 in the above embodiment, short-circuiting with the electrode fingers 23 which should have a different potential can be suppressed while dispersion of the SAW in the gaps s1 can be suppressed.

Figure 5B:
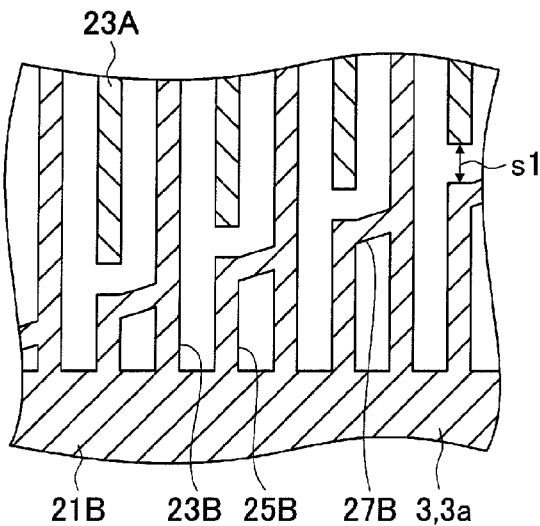

In the modification of FIG. 5B, the same auxiliary electrodes 27 as the above embodiment are provided on only one lateral side of the dummy electrodes 25. Even in this case, in the same way as the above embodiment, short-circuiting with the electrode fingers 23 which should have a different potential can be suppressed while dispersion of the SAW in the gaps s1 can be suppressed.

Figure 5C:
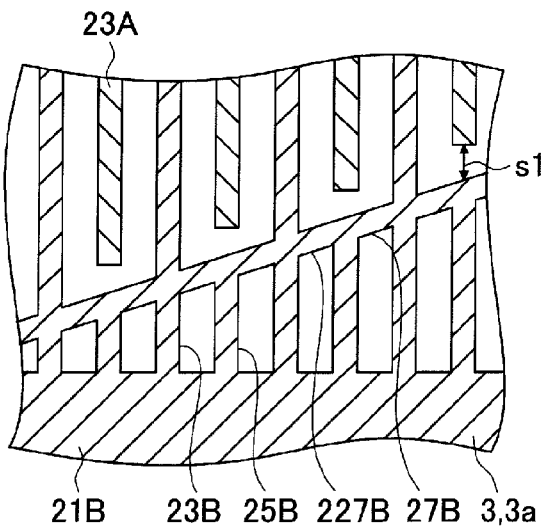

In the modification in FIG. 5C, auxiliary electrodes 27 and 227 are provided. Both of the auxiliary electrodes 27 and 227 (their edge portions at the cross range R1 (see FIG. 1A) side) extend with an inclination relative to the propagation direction of the SAW (x-direction) to the side along a line formed by connecting the front ends of the dummy electrodes 25. Preferably, they extend along the line connecting the front ends of the dummy electrodes 25.

In the auxiliary electrodes 27, in the same way as the above embodiment, the closer to the front end side, the closer in position to the cross range R1 side. In the auxiliary electrodes 227, conversely to the above embodiment, the closer to the front end side, the closer in position to the side opposite to the cross range R1. Each dummy electrode 25 is, in accordance with the shape of cross range R1 (in accordance with the position in the x-direction), provided with an auxiliary electrode 27 on one lateral one side and provided with an auxiliary electrode 227 on the other lateral side (the portion exemplified in FIG. 5C), is provided with the auxiliary electrodes 27 on its two lateral sides, or is provided with the auxiliary electrodes 227 on its two lateral sides.

In this modification as well, in the same way as the above embodiment, short-circuiting with the electrode fingers 23 which should have a different potential can be suppressed while dispersion of the SAW in the gaps s1 can be suppressed. Further, the shape of the cross range R1 and the shape of the auxiliary electrodes 27 and 227 coincide, therefore suppression of occurrence of unexpected dispersion and reflection of the SAW can be expected.

Figure 5D:
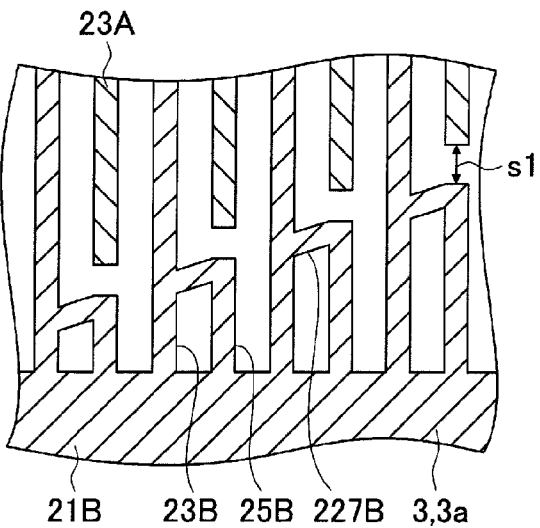

In the modification in FIG. 5D, the auxiliary electrodes 227 of FIG. 5C are provided on only one side of the dummy electrodes 25. Even in this case, in the same way as the above embodiment, short-circuiting can be suppressed by securing distance from the front ends of the electrode fingers 23 which should have a different potential while dispersion of the SAW can be suppressed by enlarging the electrode areas near the gaps s1.

Note that, the modification in FIG. 5B can be grasped as being obtained by deleting the auxiliary electrodes 227 in the modification of FIG. 5C within the range shown in FIG. 5B. In the same way, the modification in FIG. 5D can be grasped as being obtained by deleting the auxiliary electrodes 27 in the modification of FIG. 5C within the range shown in FIG. 5D. That is, the modifications of FIG. 5B to FIG. 5D can be grasped by the same concept of an apodized electrode in which the auxiliary electrodes are inclined relative to the propagation direction of SAW to the side along the line connecting the front ends of the dummy electrodes 25.

Figure 6:
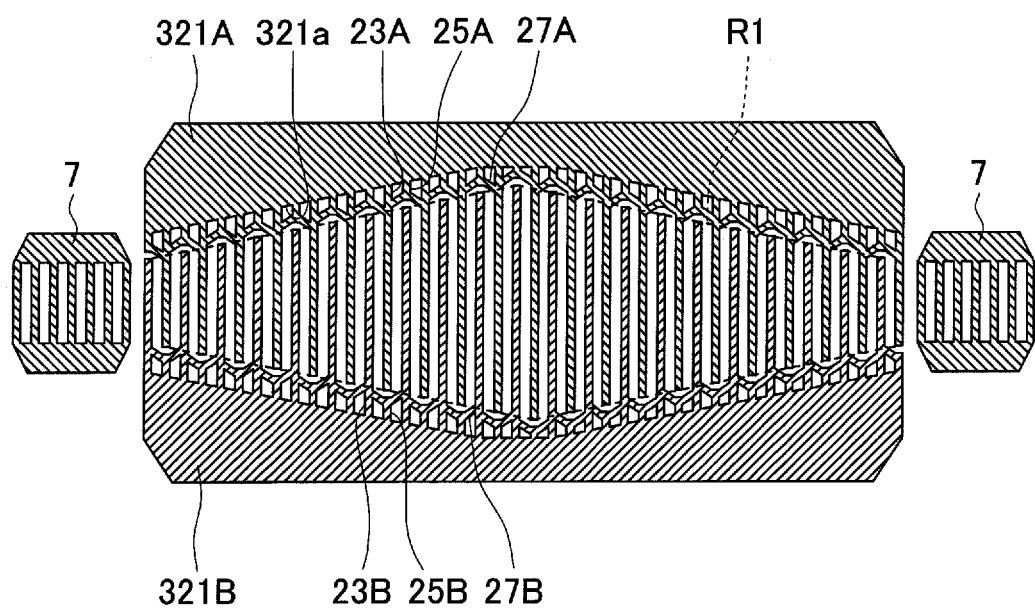

FIG. 6 is a plan view which shows a modification of the planar shapes of the bus bars as with FIG. 1A.

In this modification, the bus bars 321 extend so that their edge portions 321a on the cross range R1 side are inclined to the side to which the edge portions of the cross range R1 are inclined. Note that, the edge portions 321a and the edge portions of the cross range R1 may be parallel or not be parallel.

EXAMPLES

Various shapes and dimensions of auxiliary electrodes were set to prepare SAW elements 1. Further, the electrical characteristics thereof were checked to evaluate the propagation loss of the SAW.

(Conditions Common to Comparative Examples and Working Examples)

The conditions common to the following comparative examples and working examples are as follows.

Wavelength $\lambda$ of SAW: 2 μm
Maximum value of intersection width W: 30$\lambda$
Number of electrode fingers: 300 (150 pairs)
Number of dummy electrodes: 300
(Method of Evaluation of Propagation Loss of SAW)

FIG. 7A and FIG. 7B are diagrams explaining the method of evaluation of the propagation loss of the SAW.

FIG. 7A is a diagram which shows an impedance characteristic of the SAW element 1 as a resonator. In the diagram, the abscissa shows the frequency "f" (MHz), and the ordinate shows an absolute value |Z| (Ω) of impedance and a phase $\theta$ (deg) of the impedance Z. A solid line Lz shows the frequency change of the absolute value |Z| of the impedance, and a solid line $L_\theta$ shows the frequency change of the phase $\theta$ of the impedance.

In the diagram of the impedance characteristic, as indicated by the solid line Lz, there are a resonance point at which the absolute value |Z| of impedance becomes the local minimum and an anti-resonance point at which the absolute value |Z| of impedance becomes the local maximum. Further, between the resonance point and the anti-resonance point, the phase $\theta$ of the impedance becomes the maximum phase $\theta$max.

FIG. 7B is a diagram which shows the relationship between the maximum phase $\theta$max and the propagation loss LS of the SAW. In the diagram, the abscissa shows the propagation loss LS (dB/pm), and the ordinate shows the maximum phase θmax.

As shown in this diagram, the smaller the loss of the resonator, the larger the maximum phase θmax. Accordingly, by checking the maximum phase θmax, the loss of the resonator can be evaluated. Note that, in an ideal state where the loss is 0, the maximum phase θmax becomes 90 (deg.).

As shown in FIG. 7A, the phase θ changes near the maximum phase θmax gently with respect to the change of the frequency f, while the absolute value |Z| changes near the resonance point and anti-resonance point abruptly with respect to the change of the frequency "f". Accordingly, the maximum phase θmax can be measured more stably than the absolute value |Z|, and it is expected that the error of evaluation of the loss based on the maximum phase θmax is smaller than that the evaluation of the loss based on the absolute value |Z|.

(Influence of Shape of Auxiliary Electrodes) Comparative Examples 1 to 3 (C1 to C3) and Examples 1 to 3 (E1 to E3) in which shapes of the auxiliary electrodes were made different from each other were set and were evaluated for propagation loss of the SAW. Note that, in Examples 1 to 3, the auxiliary electrodes 27 were provided for all dummy electrodes.

Figure 8:
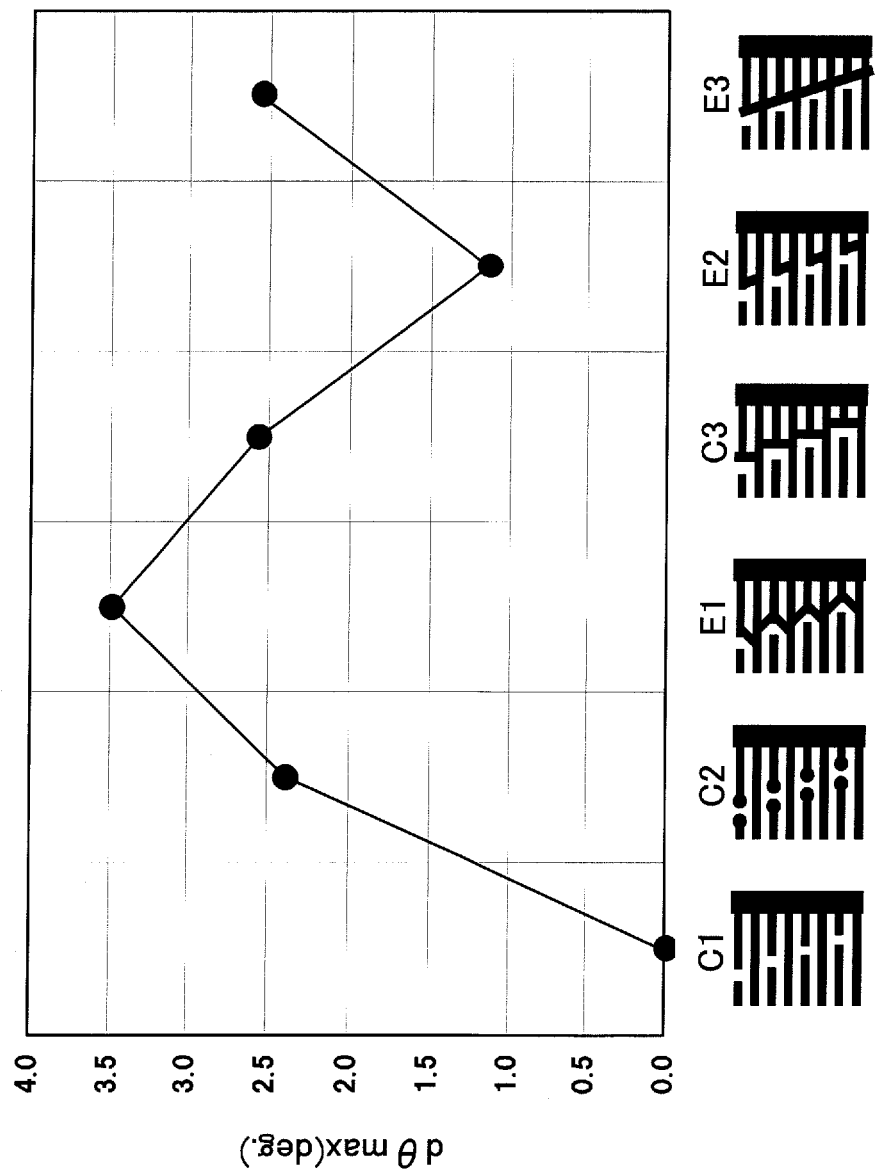

FIG. 8 is a diagram which shows these conditions and the evaluation results. In the diagram, the abscissa shows C1 to C3 and E1 to E3, and the ordinate shows the amounts of improvement dθmax of the maximum phases θmax of the comparative examples and working examples, using the maximum phase θmax of C1 as the standard.

Comparative Example 1 (C1) is not provided with auxiliary electrodes. In Comparative Example 2 (C2), the front ends of the dummy electrodes are formed in circular shapes. In Example 1 (E1), in the same way as the above embodiment, the auxiliary electrodes 27 which are positioned closer to the cross range R1 side the further to the front end sides are provided at the two lateral sides of the dummy electrodes. In Comparative Example 3 (C3), auxiliary electrodes are provided parallel to the propagation direction of the SAW. In Example 2 (E2), in the same way as the modification shown in FIG. 5D, auxiliary electrodes 227 which are positioned closer to the opposite sides from the the cross range R1 the further to the front end sides are provided on single lateral sides of the dummy electrodes. In Example 3 (E3), in the same way as the modification shown in FIG. 5C, auxiliary electrodes 27 and 227 are provided on the two lateral sides of the dummy electrodes along the line connecting the front ends of the dummy electrodes.

It was confirmed from this diagram that increase of the propagation loss of the SAW was suppressed in all of Examples 1 to 3 compared with Comparative Example 1. Further, in Example 1, the effect of suppression of increase of the propagation loss of the SAW is larger than those in all of the comparative examples and working examples. In Example 3, an effect of suppression of increase of the propagation loss of the SAW equal to that in Comparative Example 2 is obtained while short-circuiting between the electrode fingers and the dummy electrodes which should have different potentials is suppressed compared with Comparative Example 2.

Note that, when considering the variation of the finished state of the electrodes, measurement variation of about 0.3° at the maximum phase θmax may occur. On the other hand, it is considered that the maximum phase of the auxiliary electrodes 27 is improved proportional to the number of dummy electrodes having auxiliary electrodes 27. When taking into account these two things and the results of Example 1 in which the auxiliary electrodes 27 were provided for all dummy electrodes, so long as the auxiliary electrodes 27 are provided for at least 10% of all dummy electrodes, it is considered that an effect exceeding the value according to the measurement variation is obtained.

(Influence of Dimensions of Auxiliary Electrodes) Various dimensions were changed for resonators so as to evaluate the propagation loss of the SAW. In the resonators, in the same way as the embodiment, auxiliary electrodes 27 positioned closer to the cross range R1 side the further to the front end sides are provided at the two lateral sides of the dummy electrodes.

FIG. 9A shows the change of the maximum phase θmax when changing the angle α (FIG. 1B) of the auxiliary electrodes 27 relative to the direction perpendicular to the propagation direction of the SAW. The abscissa shows the angle α (deg), while the ordinate shows the maximum phase θmax (deg). Note that, the angle α uses the center line of the auxiliary electrode 27 as the standard.

Note that, the other conditions were as follows.
Width w2 of auxiliary electrodes 27 (FIG. 1B): 0.5 μm
Connecting position of auxiliary electrodes 27 (distance "d", FIG. 1B): 0.75 μm It is suggested from this diagram that the smaller the angle α is made, i.e., in other words, the closer the front end to the cross range R1, the more the propagation loss of the SAW is suppressed. This is considered to be because the smaller the angle α becomes, the easier it is for the gaps s1 to be closed when viewed in the propagation direction of the SAW or the easier it is for the electrode areas in the vicinity of the gaps s1 to be increased. Further, it was confirmed too in these examples that, at the time when the angle α is 45°, short-circuiting between the auxiliary electrodes 27 and the electrode fingers 23 which should become different potentials did not occur.

If the angle α becomes even a little larger than 90°, the benefit of suppression of the propagation loss is obtained. Further, in these examples, a significant difference (effect) is confirmed at the time when the angle α is 60° compared with that at the time when the angle α is 90°.

On the other hand, when the angle α is made too small, a distance s2 (FIG. 1B) between the auxiliary electrodes 27 and the electrode fingers 23 which should have different potentials becomes short, so there is apprehension of short-circuiting between them. The distance s2 between the auxiliary electrodes 27 and the electrode fingers 23 which should have different potentials is expressed by for example (s1 x sin α) by assuming that the edge portions 27a of the auxiliary electrodes 27 match the edge portions of the front ends of the dummy electrodes 25. When supposing that s1 is about 0.2λ, empirically, up to when s2 is about 0.1λ, the possibility of occurrence of short-circuiting is low, therefore sine may be set to 0.5 or more. That is, α may be set to 30° or more.

From the above, the angle α is preferably 30° to 60°. Further, when assuming a change of conditions such as s1, d, and w2, more preferably, the angle is about 45° near the center thereof.

FIG. 9B shows the change of the maximum phase θmax when changing the width w2 of the auxiliary electrodes 27. The abscissa shows the width w2 (μm), while the ordinate shows the maximum phase θmax (deg.).

Note that, the other conditions were as follows.
Angle α of auxiliary electrodes 27: 45°
Connecting position of auxiliary electrodes 27 (distance d): 0.75 μm It is suggested from this diagram that the propagation loss of the SAW is suppressed when the width w2 is made larger and further that the effect of suppression of the propagation loss reaches a peak when the width w2 is made further larger. This is considered to be because when the width w2 is small, the areas of the auxiliary electrodes 27 are small, therefore the effect of substantially burying the gaps s1 is not sufficient, and the propagation loss which occurs after securing areas in the auxiliary electrodes 27 large enough to suppress the dispersion of the SAW from the gaps s1 is the problem of loss in the SAW element 1 as a whole, but is not the problem of loss in the gaps s1. In the examples, the point at which the effect of suppression of the propagation loss reached the peak was the vicinity of 0.50 μm (0.25λ).

Further, when the regions surrounded by the electrode fingers 23, dummy electrodes 25, and auxiliary electrodes 27 which should have the same potential are all buried by the electrodes (when the bus bars 21 are made wide without provision of the dummy electrodes 25 and auxiliary electrodes 27), the electrical characteristics rather fall. This is similar to the state where the width w2 of the auxiliary electrodes 27 is made larger up to the limit, so existence of an upper limit value in the width w2 is suggested. Further, although depending also on the distance "d" showing the connecting position, the larger the width w2, the shorter the distance s2 between the auxiliary electrodes 27 and the electrode fingers 23 which should have different potentials. Therefore, there is an apprehension of short-circuiting between them. On the other hand, in the examples, it is confirmed that an effect of suppression of the propagation loss is obtained at the time when the width w2 is 1 μm (0.5λ) and that short-circuiting does not occur between the auxiliary electrodes 27 and the electrode fingers 23 which should have different potentials.

From the above, the width w2 is preferably 0.25λ to 0.5λ, i.e., from another viewpoint, 0.50 μm to 1 μm.

FIG. 9C shows the change of the maximum phase θmax when changing the connecting position (distance "d") of the auxiliary electrodes 27. The abscissa shows the distance "d" (μm), and the ordinate shows the maximum phase θmax (deg).

Note that, the other conditions were as follows.

Angle α of auxiliary electrodes 27: 45°

Width w2 of auxiliary electrodes 27: 0.5 μm

It is suggested from this diagram that the closer the auxiliary electrodes 27 are made to the cross range R1 side, the more the propagation loss of the SAW is suppressed. This is considered to because the closer the auxiliary electrodes 27 to the cross range R1, the easier it is for the gaps s1 to be closed when viewed in the propagation direction of the SAW or the easier it is for the electrode areas in the vicinity of the gaps s1 to increase.

In these examples, it was confirmed that when the distance "d" was 0.50 μm (0.25λ) or more and 0.75 μm (0.38λ) or less, a sufficient propagation loss suppression effect giving a maximum phase θmax exceeding 83° was obtained and short-circuiting did not occur between the auxiliary electrodes 27 and the electrode fingers 23 which should have different potentials. Accordingly, a preferred range of the distance "d" is 0.25λ or more and 0.38λ or less, i.e., from another viewpoint, 0.50 μm or more and 0.75 μm or less.

The present invention is not limited to the above examples and may be worked in various ways.

The acoustic wave element is not limited to a SAW element (in the narrow sense). For example, it may be a so-called elastic boundary wave element (note, included in SAW elements in a broad sense) in which the thickness of the protective layer (11) is relatively large (for example 0.5λ to 2λ) as well. Note that, in the elastic boundary wave element, formation of the vibration space (33a) is unnecessary, and accordingly the cover 33 etc. are unnecessary.

Further, the acoustic wave element is not limited to a wafer level packaged one. For example, in the SAW element, the cover 33 and terminals 35 etc. need not be provided, and the pads 39 on the top surface 3a of the substrate 3 and the mounting-use pads 55 of the circuit board 53 may be directly bonded by solder 57. Further, the vibration space may be formed by a clearance between the SAW element 1 (protective layer 11) and the mounting surface 53a of the circuit board 53. Further, the wafer level packaged acoustic wave element may be given a variety of configurations such as a configuration in which terminals are not provided, and the pads 39 abut against solder balls arranged on the mounting-use pads 55.

The IDT electrode is not limited to an apodized electrode in which the intersection width changes in the propagation direction of the acoustic wave. The intersection width may be constant as well. Even in this case, the propagation loss due to the dispersion of the SAW in the gaps s1 can be suppressed. The first electrode fingers and the second electrode fingers need not be alternately arranged over the entire propagation direction of the acoustic wave. At part, the first electrode fingers may be adjacent to each other or the second electrode fingers may be adjacent to each other with a distance of about a half wavelength of the acoustic wave.

The shape of the auxiliary electrodes is not limited to the shapes exemplified in the embodiment and the modifications.

For example, in auxiliary electrodes where the edge portions (27a) on the cross range (R1) side are positioned closer to the cross range side the further to the front end sides like in the auxiliary electrodes in the above embodiment, the edge portions (27b) on the opposite side to the cross range do not have to be positioned closer to the cross range side the further to the front end sides.

For example, as exemplified in FIG. 10A, in the auxiliary electrodes 427, the edge portions 427a on the cross range side (first electrode finger 23A side) may be positioned closer to the cross range side the further to the front end sides, while the edge portions 427b on the opposite side may be parallel to the propagation direction of the SAW.

Further, the edge portions on the opposite side to the cross range (42 7b etc.) may be positioned closer to the side opposite from the cross range the further to the front end sides. Further, from another viewpoint, the edge portions (427a etc.) at the cross range side and the edge portions (427b etc.) at the opposite side need not be parallel to each other. That is, these edge portions may be longer in distance between them the further to the front end sides, may be shorter in distance between them further to the front end sides, or may be longer or shorter in distance between them at both the base ends and the front ends.

Further, in the embodiment, the front ends of the electrode fingers 23 etc. were formed in rectangular shapes having corner portions, but the corner portions may be chamfered as well.

For example, as exemplified in FIG. 10B, the corner portions of the electrode fingers 523 may be rounded (chamfering by curves) as well. Note that, when the chamfering is large, the entire edge portions of the front ends of the electrode fingers 523 exhibit convex curved shapes (example of FIG. 10B).

In the same way, the corner portions where the edge portions 527a of the auxiliary electrodes 527 on the cross range side (first electrode finger 523A side) and the edge portions of the front ends of the dummy electrodes 525 intersect and the corner portions where the edge portions 527a and the edge portions of the electrode fingers 523 on the auxiliary electrode 527 side intersect may be rounded as well. By this chamfering, the edge portions 527a extend in a concave shape where the electrode finger 523 side is made concave. Note that, when the chamfering is large, the entireness of the edge portions 527a of the auxiliary electrodes 527 and the edge portions of front ends of the dummy electrodes 525 exhibit curved shapes in which the front end sides of the electrode fingers 523 are made concave.

By formation in this shape, compared with the case where the corner portions are not rounded, it becomes easy to secure distance between the front ends of the electrode fingers 523 and the edge portions 527a (further the distance can be made constant), and the electrode areas in the vicinity of the gaps s1 can be made large.

Note that, for a shape including a curve as shown in FIG. 10B, a pattern including a curve may be formed in a photo mask with the intention of forming the curve from the start or a pattern comprised of a combination of straight lines (including corner portions) may be formed in the photo mask, then the etching conditions adjusted so as to round the corner portions or make the straight lines in the vicinity of the corner portions curved.

Further, the edge portions of the front ends of the dummy electrodes and the edge portions on the cross range side of the auxiliary electrodes which protrude from the dummy electrodes need not coincide in their positions in the direction perpendicular to the propagation direction of the SAW.

For example, as shown in FIG. 11, the edge portions 27a of the auxiliary electrodes 27 may be deviated to the base sides of the dummy electrodes 25 relative to the edge portions of the front ends of the dummy electrodes 25. In other words, the front ends of the dummy electrodes 25 may protrude from the edge portions 27a of the auxiliary electrodes 27.

Even in this case, by securing the electrode areas in the vicinity of the gaps s1, more preferably, by closing at least a portion of the gaps s1 by the edge portions 27a of the auxiliary electrodes 27 when viewed in the propagation direction of the SAW, the same effects as those by the embodiment are obtained.

The embodiment and the modifications may be suitably combined. For example, the modifications shown in FIG. 5B and FIG. 5D may be mixed in one IDT electrode, or the chamfering shown in FIG. 10B may be applied to the modifications in FIG. 5A to FIG. 5D.

In the acoustic wave element, the protective layer 11 and added films 9 are not essential factors. Further, the protective layer may be provided for only the purpose of preventing corrosion and may be made thinner than the electrode fingers.

The top surface of the protective layer 11 may have concave-convex shapes so as to form convexes at the positions of the electrode fingers. In this case, the reflection coefficients at the electrode fingers and at the positions where they are not arranged can be made higher. The concave-convex shapes may be formed due to the thickness of the electrode fingers at the time of film formation of the protective layer as explained with reference to FIG. 3E or may be formed by etching the surface of the protective layer in the regions between the electrode fingers.

The added films are preferably provided over the entire surface of the electrode. However, the added films may be provided only at portions of the electrodes, for example, may be provided only on the electrode fingers. Further, the added films may be provided only at portions at the center side when viewed in the longitudinal direction of the electrode fingers. Furthermore, the added films may be provided not only on the top surfaces of the electrodes, but also over the side surfaces.

The material of the added films may be a conductive material or insulating material. Specifically, tungsten (W), iridium (Ir), tantalum (Ta), copper (Cu), and other conductive materials and $Ba_xSr_{1-x}O_3$, $Pb_xZn_{1-x}O_3$, $ZnO_3$, and other insulating materials can be mentioned as the material of the added films.

By forming the added films by an insulating material, compared with the case of forming the added films by a metal material, corrosion of the electrodes is suppressed, and the electrical characteristics of the acoustic wave element can be stabilized. This is because pinholes are sometimes formed in a protective layer made of $SiO_2$. When such pinholes are formed, moisture will intrude up to the electrode portions through them. If metal films made of a material different from the electrode material are arranged on the electrodes, corrosion due to a battery effect between dissimilar metals is caused by the intruded moisture. Accordingly, since almost no battery effect occurs between the electrodes and the added films if the added films are formed by the insulating material such as $Ta_2O_5$, an acoustic wave element suppressed in corrosion of electrodes, so having a higher reliability can be obtained.

For the substrate, other than the 128°±10° Y-X cut $LiNbO_3$ substrate, for example, use can be made of 38.7°±Y-X cut $LiTaO_3$ etc. The material of the electrodes (electrode fingers) is not limited to Al and an alloy containing Al as the principal ingredient and may be for example Cu, Ag, Au, Pt, W, Ta, Mo, Ni, Co, Cr, Fe, Mn, Zn, or Ti. The material of the protective layer is not limited to $SiO_2$ and may be for example a silicon oxide other than $SiO_2$.

REFERENCE SIGNS LIST 1, 31 . . . SAW elements (acoustic wave elements), 3 . . . substrate (piezoelectric substrate), 3a . . . top surface, 5 . . . IDT electrode (electrode), 9 . . . added film, 11 . . . protective layer, 21 . . . bus bar, 23 . . . electrode finger, 25 . . . dummy electrode, 27 . . . auxiliary electrode, 51 . . . SAW device (surface acoustic wave device), and 53 . . . circuit board.

The invention claimed is:

1. An acoustic wave element, comprising:
a piezoelectric substrate; and
an IDT electrode located on a top surface of the piezoelectric substrate;
wherein the IDT electrode comprises
a first bus bar and a second bus bar which face each other in a direction perpendicular to a propagation direction of an acoustic wave,
a plurality of first electrode fingers which extend from the first bus bar toward the second bus bar and are aligned in the propagation direction,
a plurality of second electrode fingers which extend from the second bus bar toward the first bus bar, are aligned in the propagation direction, and mutually intersect with the plurality of first electrode fingers,
a plurality of first dummy electrodes which extend from the first bus bar toward the second bus bar, are aligned in the propagation direction, and comprise front ends which face front ends of the plurality of second electrode fingers with a gap,
a plurality of second dummy electrodes which extend from the second bus bar toward the first bus bar, are aligned in the propagation direction, and comprise front ends which face front ends of the plurality of first electrode fingers with a gap,
a plurality of first auxiliary electrodes which protrude toward sides from front end side portions of the plurality of first dummy electrodes, and a plurality of second auxiliary electrodes which protrude toward sides from front end side portions of the plurality of second dummy electrodes, at least part of the plurality of first auxiliary electrodes comprise edge portions located near a side of the second bus bar, the edge portions being located closer to the side of the second bus bar the closer the edge portion is to a side of the front end, and at least part of the plurality of second auxiliary electrodes comprise edge portions located near a side of the first bus bar, the edge portions being located closer to a side of the first bus bar the closer the edge portion is to a side of the front end.

2. The acoustic wave element according to claim 1, wherein the IDT electrode is an apodized electrode in which intersection widths of the plurality of first electrode fingers and the plurality of second electrode fingers vary in the propagation direction.

3. The acoustic wave element according to claim 1, wherein
with respect to at least part of the plurality of first dummy electrodes,
the first electrode fingers are located at both sides of the plurality of first dummy electrodes and a pair of the first auxiliary electrodes among the plurality of the first auxiliary electrodes protrudes from a front end side portion toward both sides of the plurality of first dummy electrodes,
each of the pair of first auxiliary electrodes comprising an edge part of a side of the second bus bar which are located closer to the second bus bar the closer the edge part is to a front end of the pair of first auxiliary electrodes, and
with respect to at least part of the plurality of second dummy electrodes,
the second electrode fingers are located at both sides of the plurality of second dummy electrodes and a pair of the second auxiliary electrodes among the plurality of the second auxiliary electrodes protrudes a from front end side portion toward both sides of the plurality of second dummy electrodes,
each of the pair of second auxiliary electrodes comprising an edge part of a side of the first bus bar which are located closer to the first bus bar the closer the edge part is to a front end of the pair of second auxiliary electrodes.

4. The acoustic wave element according to claim 2, wherein
with respect to at least part of the plurality of first dummy electrodes,
the first electrode fingers are located at both sides of the plurality of first dummy electrodes and a pair of the first auxiliary electrodes among the plurality of the first auxiliary electrodes protrudes from a front end side portion toward both sides of the plurality of first dummy electrodes,
each of the pair of first auxiliary electrodes comprising an edge part of a side of the second bus bar which extend with an inclination relative to the propagation direction toward the side along a line connecting the front ends of the plurality of first dummy electrodes,
with respect to at least part of the plurality of second dummy electrodes,
the second electrode fingers are located at both sides of the plurality of second dummy electrodes and a pair of the second auxiliary electrodes among the plurality of the second auxiliary electrodes protrudes from an end side portion toward both sides of the plurality of second dummy electrodes, and
each of the pair of second auxiliary electrodes comprising an edge part of a side of the first bus bar which extend with an inclination relative to the propagation direction toward the side along a line connecting the front ends of the plurality of second dummy electrodes.

5. The acoustic wave element according to claim 3, wherein
the plurality of first auxiliary electrodes are connected at their front ends to the plurality of first electrode fingers,
corner portions at which the edge parts of sides of the second bus bar of the plurality of first auxiliary electrodes and the edge parts of the front ends of the first dummy electrodes intersect and
corner portions at which the edge part of sides of the second bus bar of the plurality of first auxiliary electrodes and the edge parts of the first electrode fingers adjacent to the first auxiliary electrodes intersect are chamfered so as to be rounded,
the plurality of second auxiliary electrodes are connected at their front ends to the plurality of second electrode fingers, and
corner portions at which the edge part of sides of the first bus bar of the plurality of second auxiliary electrodes and the edge part of the front ends of the second dummy electrodes intersect and
corner portions at which the edge parts of sides of the first bus bar of the plurality of second auxiliary electrodes and the edge parts of the second electrode fingers adjacent to the second auxiliary electrodes intersect are chamfered so as to be rounded.

6. The acoustic wave element according to claim 1, wherein front ends of the plurality of first auxiliary electrodes are connected to the plurality of first electrode fingers, and front ends of the plurality of second auxiliary electrodes are connected to the plurality of second electrode fingers.

7. The acoustic wave element according to claim 1, further comprising a protective layer which is made of $SiO_2$, covers the top surfaces of the IDT electrode and the piezoelectric substrate, and has a thickness from the top surface of the piezoelectric surface larger than the thickness of the IDT electrode, wherein the IDT electrode is made of a material containing Al as a major component.

8. The acoustic wave element according to claim 7, further comprising an added film which is located on the top surface of the IDT electrode, is covered by the protective layer, and is composed of a material as a major component which has a large acoustic impedance and slow propagation velocity of an acoustic wave compared with the material of the IDT electrode and a material of the protective layer.

9. An acoustic wave element, comprising a piezoelectric substrate; and
an IDT electrode located on a top surface of the piezoelectric substrate;
wherein the IDT electrode comprises a first bus bar and a second bus bar which face each other in a direction perpendicular to a propagation direction of an acoustic wave, a plurality of first electrode fingers which extend from the first bus bar toward the second bus bar and are aligned in the propagation direction, a plurality of second electrode fingers which extend from the second bus bar toward the first bus bar, are aligned in the propagation direction, and mutually intersect with the plurality of first electrode fingers, a plurality of first dummy electrodes which extend from the first bus bar toward the second bus bar, are aligned in the propagation direction, and comprise front ends which face the front ends of the plurality of second electrode fingers with a gap, a plurality of second dummy electrodes which extend from the second bus bar toward the first bus bar, are aligned in the propagation direction, and comprise front ends which face the front ends of the plurality of first electrode fingers with a gap, first auxiliary electrodes which protrude from front end side portions of the plurality of first dummy electrodes with a slant relative to the propagation direction, and second auxiliary electrodes which protrude from front end side portions of the plurality of second dummy electrodes with a slant relative to the propagation direction.

10. An acoustic wave device, comprising an acoustic wave element according to claim 1 and a circuit board on which the acoustic wave element is mounted.

\* \* \* \* \*